US005748426A

United States Patent [19]
Bedingfield et al.

[11] Patent Number: 5,748,426
[45] Date of Patent: May 5, 1998

[54] METHOD FOR INTERFACING TO A POWERED BUS

[75] Inventors: John Bedingfield, Largo; Michael A. Hicks, St. Petersburg, both of Fla.

[73] Assignee: Paradyne Corporation, Largo, Fla.

[21] Appl. No.: 639,541

[22] Filed: Apr. 29, 1996

[51] Int. Cl.[6] ........................... H02H 9/00; H02H 1/04
[52] U.S. Cl. ................................. 361/58; 361/110
[58] Field of Search ........................... 323/908; 361/18, 361/56, 58, 91, 110, 111; 439/924.1, 163, 640, 928.1, 945, 946, 947, 952

[56] References Cited

U.S. PATENT DOCUMENTS

| | | | |
|---|---|---|---|
| 4,510,553 | 4/1985 | Faultersack | 439/924.1 |
| 5,268,592 | 12/1993 | Bellamy et al. | 361/58 |

Primary Examiner—Ronald W. Leja
Attorney, Agent, or Firm—Thomas, Kayden, Horstemeyer & Risley, L.L.P.

[57] ABSTRACT

A circuit card is interfaced to a powered electrical bus by applying power to the circuit card before it interfaces to the electrical bus or by removing power from the circuit card after it has been removed from the bus. This is accomplished using a power cord that connects the equipment's power supply to a mating connector on the card to be inserted or removed. Attaching the power cord to the mating connector of the card disables the output drivers that provide output signals to the equipment's communication bus and places the card in a reset state. This prevents introducing error signals onto the communication bus. Additionally, the contacts on the edge connector are sequenced to prevent applying power to the circuit card before a ground is available. Additionally, the power cord and circuit card are keyed to prevent improper insertion and the power card includes an inductor to provide surge protection.

10 Claims, 3 Drawing Sheets

5,748,426

1

METHOD FOR INTERFACING TO A POWERED BUS

BACKGROUND OF THE INVENTION

(1) Field of the Invention

The present invention relates to electrical equipment; more specifically, interfacing to a bus interface without removing power from that electrical interface.

(2) Description of the Related Art

In many applications using electrical equipment, it is desirable to provide an uninterrupted service. For example, a computer acting as a server for a local area network should be very reliable because any downtime on the server interferes with many users. In an effort to reduce downtime, electrical equipment typically includes a large amount of redundancy, i.e., several circuit cards performing the same function. This enables the computer or electrical equipment to use one of the redundant electrical cards if a failure occurs in a card presently being used. This permits the equipment to continue operating without producing "downtime". The failed circuit cards should be replaced so as to maintain a high level of redundancy if there are any other additional failures. In the past, replacing circuit cards in equipment not specifically designed for "Hot" insertion, involved powering down or turning off the equipment in which the card is located. This results in an interruption of service to users dependent on the piece of equipment. As a result, it is desirable to replace circuit cards without turning power off to the equipment in which the card is located. When replacing a circuit card without turning power off, there is a danger of applying signals to an unpowered device or introducing unwanted transient conditions onto a communication bus and thereby interfering with the operation of the electrical equipment or possibly causing a failure.

SUMMARY OF THE INVENTION

A circuit card is interfaced to a powered electrical bus by applying power to the circuit card before it interfaces to the electrical bus or by removing power from the circuit card after it has been removed from the bus. This is accomplished using a power cord that connects the equipment's power supply to a mating edge connector on the card to be inserted or removed. Attaching the power cord to the mating edge connector of the card disables the output drivers that provide output signals to the equipment's communication bus. This prevents introducing error signals onto the communication bus. Additionally, the contacts on the edge connector are sequenced to prevent applying power to the circuit card before a ground is available. Additionally, the power cord and circuit card are keyed to prevent improper insertion, and an inductor is included in the power card to prevent surge currents.

DETAILED DESCRIPTION OF THE INVENTION

Figure 1:
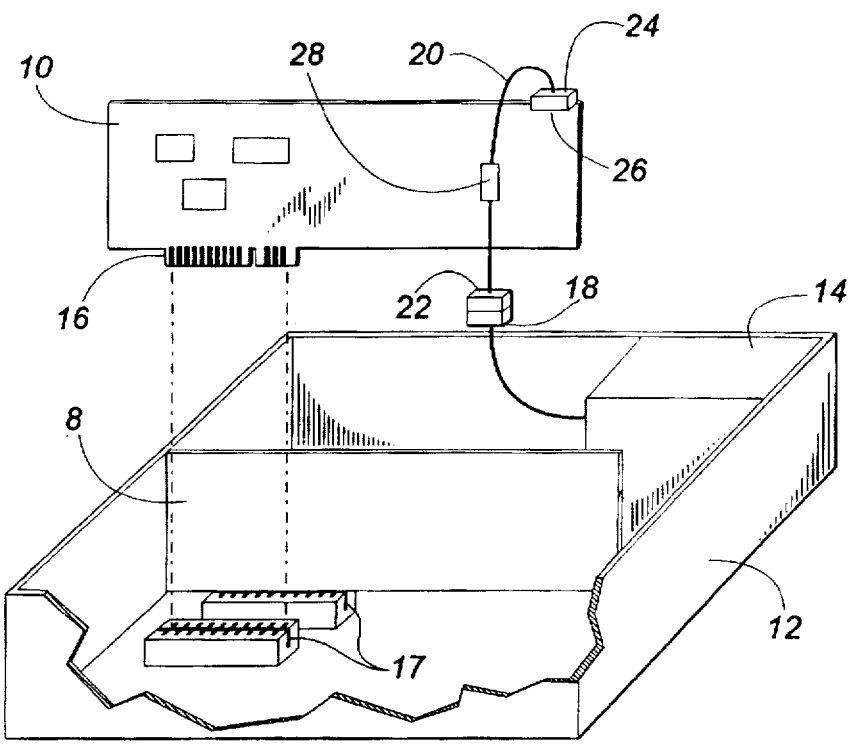
FIG. 1 illustrates the insertion/removal of a circuit card using a power cord.

FIG. 1 illustrates the insertion/removal of circuit card 10 from personal computer 12. Personal computer 12 includes

2 power supply 14. Signals including power, data and control signals are distributed throughout computer 12 by an electrical bus such as an ISA bus. Other types of standard and nonstandard buses may be used. Edge connector 16 of circuit card, 8 and 10 interface with one of connectors 17 which are in electrical contact with the computer's electrical bus.

Figure 4:
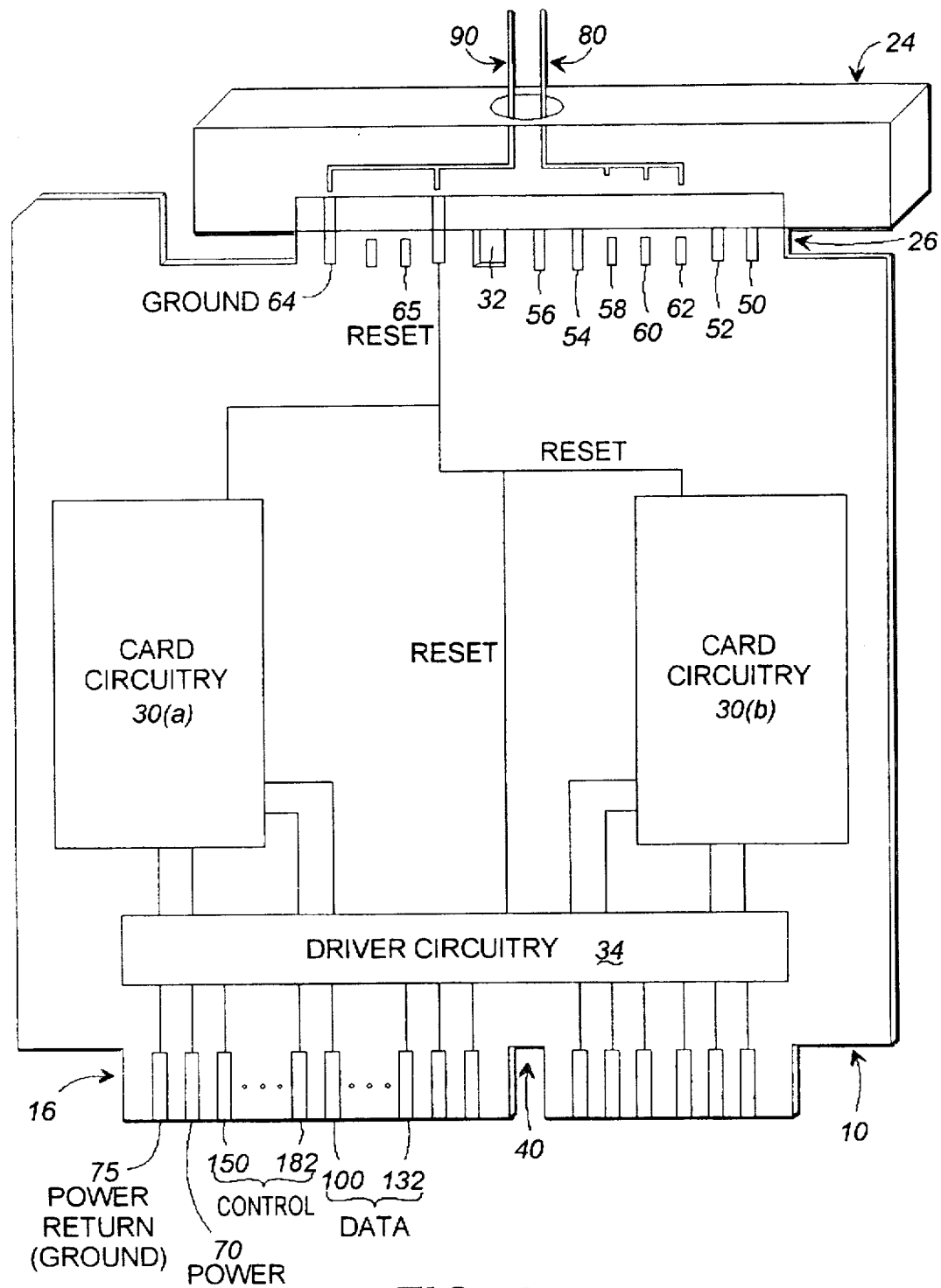
FIG. 4 illustrates disabling of the driver circuit and placing a circuit located on the circuit card into a predetermined state.

FIG. 4 shows edge connector 16 of circuit card 10, including power 70, power return 75, data 100–132 and control 150–182 signals that connect to the computer's electrical bus. Typically, in a computer system, power supply 14 includes a unused power connector such as power connector 18. Power connector 18 is connected to power cord 20 which incorporates a power conductor 80 and a return conductor 90, as shown in FIG. 4. Power cord 20 includes connector 22 which mates with connector 18 of power supply 14. At the other end of power cord 20 is connector 24 which mates with edge connector 26 of circuit card 10. It should be noted that other types of mating connectors with sequenced power and ground contacts may be used in place of connectors 24 and 26. Power cord 20 should also include surge filter 28. Surge filter 28 may be a commercially-available surge filter or a simple inductor.

When circuit card 10 is to be inserted into personal computer 12 without turning off power supply 14, power cord 20 is used. Initially, connector 22 of power cord 20 is mated with connector 18 of power supply 14. Next, connector 24 of power cord 20 is mated with edge connector 26 of circuit card 10. Edge connector 26 and connector 24 are keyed so that they only mate in one way and therefore cannot be accidentally reversed. When connector 24 is mated with connector 26, the contacts on edge connector 26 are sequenced so that ground contact is made before power contact is made. Additionally, connector 24 shorts together some contacts on edge connector 26 so that the circuitry on circuit card 10 is put in a benign state. Alternatively, connector 24 may apply ground or power to one or more contacts of connector 26 to place the circuit card in a benign state. For example, a benign state is a state where driver circuitry that electrically interfaces to computer 12's bus through edge connector 16 is disabled and the circuitry on circuit card 10 is put in a reset, known or predetermined state so that incorrect signals are not put on to the bus when the drivers are enabled. This is demonstrated in FIG. 4.

Figure 5:
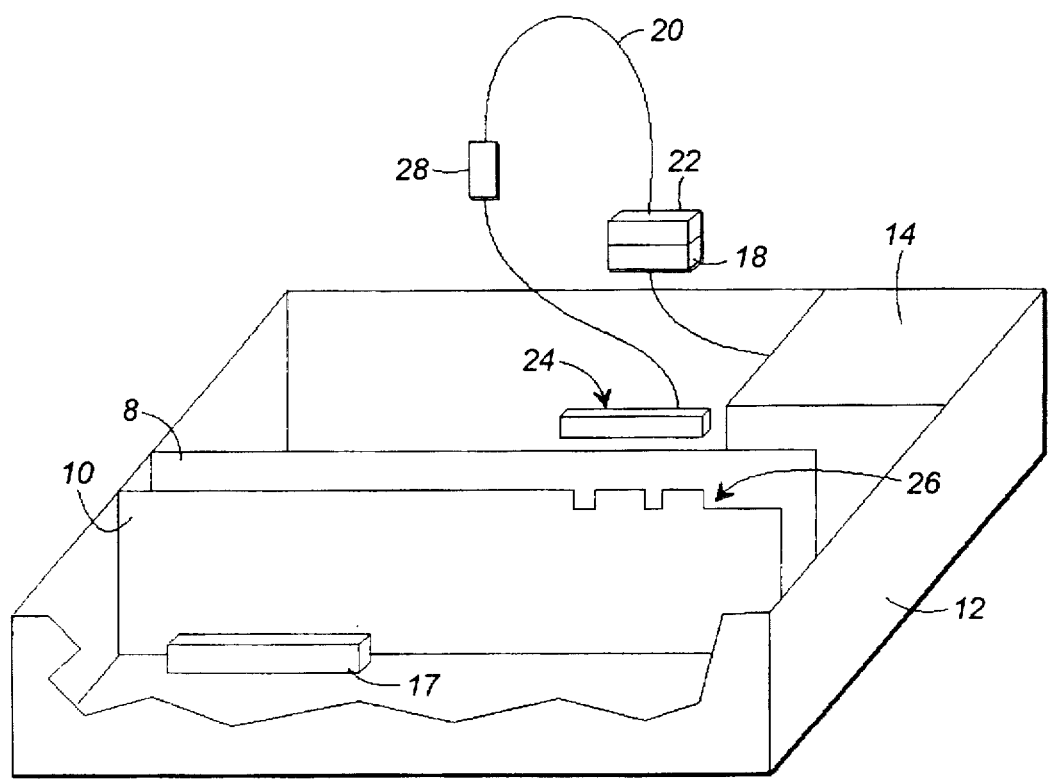
FIG. 5 illustrates enabling of the driver circuit.

After connectors 24 and 26 are mated, circuit card 10 is inserted into computer 12 so that edge connector 16 mates with connector 17 of computer 12's electrical bus. As was with edge connector 26, edge connector 16 is keyed to prevent improper mating between edge connector 16 and connector 17. After edge connector 16 is mated with the connector of the electrical bus, power cord 20 is disconnected by disconnecting connectors 24 and 26, circuit card 10 is enabled as shown in FIG. 5. Optionally disconnecting connectors 22 and 18 will also disconnect the power cord 20. Circuit card 10 has now been mated with computer 12's bus without powering down power supply 14 while preventing incorrect signaling on the bus.

Circuit card 10 can be removed from computer 12 without powering down power supply 14 by first connecting connector 22 to connector 18 and then connector 24 to connector 26. After power cord 20 has been installed, circuit card 10 may be removed by disengaging connector 16 from connector 17. After connector 16 has been disengaged, connectors 24 and 26 may be disengaged to remove the card.

Figure 2:
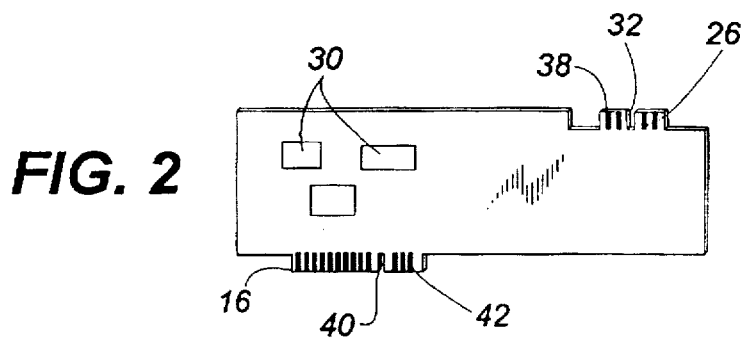
FIG. 2 illustrates the circuit card of FIG. 1 and its keyed edge connectors.

FIG. 2 illustrates circuit card 10. Circuit card 10 includes edge connector 16 and edge connector 26. It also includes electrical components such as electrical components 30. Edge connector 26 has keyway 32 which mates with a corresponding key of connector 24. Electrical contacts 38 of edge connector 26 mate with electrical contacts within connector 24. Similarly, edge connector 16 has keyway 40 which mates with a corresponding key of connector 17. Connector 17 is electrically connected to computer 12's bus. Electrical contacts 42 of connection 16 mate with electrical contacts within connector 17.

Figure 3:
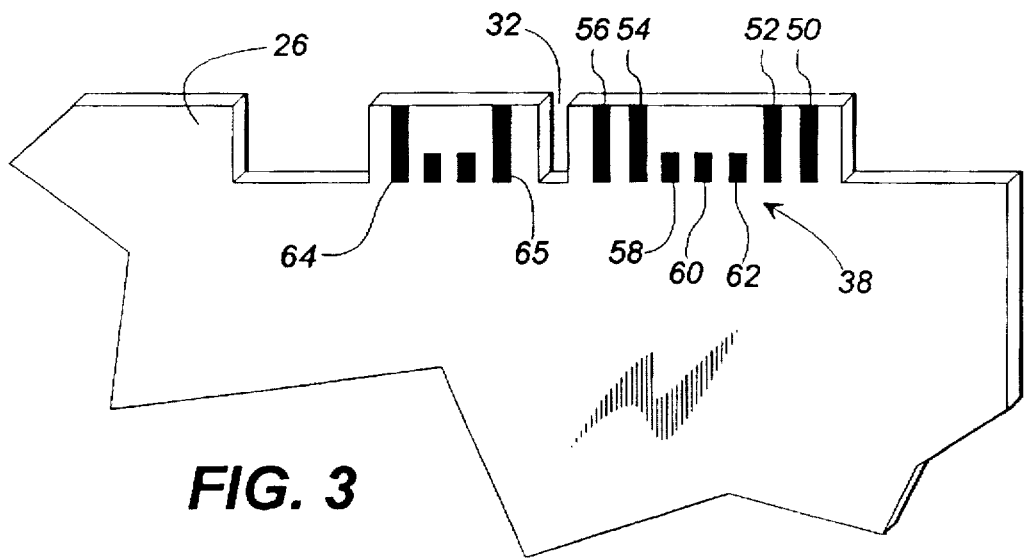
FIG. 3 illustrates the upper edge connector of the circuit card of FIG. 2.

FIG. 3 is an enlargement of edge connector 26. Keyway 32 is visible. It should be noted that contacts 38 are sequenced. For example, contacts 50, 52, 54, 56 and 64 are connected to ground conductor of circuit card 10 and contacts 58, 60, and 62 are connected to the power conductors of circuit card 10. Since the ground connection contacts are closer to the edge of edge connector 26, they will make contact with their corresponding contacts of connector 24 before contact is made between power contacts 58, 60 and 62, and their corresponding contacts of connector 24. This provides a sequenced connection where ground contact is made before power contact is made. Additionally, reset contact 65 is shorted to ground 64 when connector 24 is attached. This is demonstrated in FIG. 4. This sets circuit board 10 into a benign or reset state so that when the board is eventually enabled onto computer 12's bus, the circuit board is enabled from a known state and thereby prevents sending incorrect signaling over the bus.

The invention claimed is:

1. A method for interfacing a circuit card to a powered electrical bus, comprising the steps of:

applying a current to the circuit card using a first power conductor and a first return conductor that interface between a power source and a first electrical interface on the circuit card, wherein the step of applying the current disables a driver circuit, located on the circuit card, that electrically interfaces to the powered electrical bus;

interfacing the circuit card to the powered electrical bus, comprising a second power conductor and a second return conductor, by mating a second electrical interface on the circuit card to the powered electrical bus; and enabling the driver circuit by removing the first power conductor and the first return conductor from the circuit card, after the second electrical interface is mated to the powered electrical bus.

2. The method of claim 1, wherein the step of applying a current comprises surge filtering the current provided to the circuit card.

3. The method of claim 1, wherein the step of applying a current comprises electrically interfacing the first return conductor to a first return contact of the first electrical interface before electrically interfacing the first power conductor to a first power contact of the first electrical interface.

4. The method of claim 1, wherein the step of applying a current comprises placing a circuit located on the circuit card into a predetermined state.

5. A method for interfacing a circuit card to a powered electrical bus, comprising the steps of:

applying a current to the circuit card using a first power conductor and a first return conductor that interface between a power source and a first electrical interface on the circuit card, the first return conductor being electrically interfaced to a first return contact of the first electrical interface before electrically interfacing the first power conductor to a first power contact of the first electrical interface;

surge filtering the current provided to the circuit card;

disabling a driver circuit that electrically interfaces to the powered electrical bus, the driver circuit being located on the circuit card;

interfacing the circuit card to the powered electrical bus, comprising a second power conductor and a second return conductor, by mating a second electrical interface on the circuit card to the powered electrical bus; and enabling the driver circuit after the second electrical interface is mated to the powered electrical bus, and after the first power conductor and the first return conductor are removed from the circuit card.

6. An apparatus for interfacing a circuit card to a powered electrical bus, comprising a first power conductor, a first return conductor, a power source, wherein the first power conductor and the first return conductor provide an interface between the power source and a first electrical interface on the circuit card;

a second power conductor and a second return conductor, wherein the second power conductor and the second return conductor, being on the powered electrical bus, provide an interface between the powered electrical bus and a second electrical interface on the circuit card;

wherein the circuit card is disabled upon connection of the first power conductor and the first return conductor, to the circuit card; and wherein the circuit card is enabled after the second electrical interface is mated to the powered electrical bus, and the first power conductor and the first return conductor are removed from the circuit card.

7. The apparatus of claim 6, wherein the first power conductor further comprising a surge filter for filtering the current provided to the circuit card.

8. The apparatus of claim 6, wherein the first electrical interface further comprises:

a first return contact for electrically interfacing the first return conductor to the first electrical interface before electrically interfacing the first power conductor to a first power contact of the first electrical interface.

9. The apparatus of claim 6, wherein the circuit card further comprises:

a driver circuit that electrically interfaces to the powered electrical bus; and wherein the driver circuit is disabled upon connection of the first power conductor and the first return conductor, to the circuit card.

10. The apparatus of claim 9 wherein the driver circuit is enabled after the second electrical interface is mated to the powered electrical bus and the first power conductor and the first return conductor is removed from the circuit card.

\* \* \* \* \*

UNITED STATES PATENT AND TRADEMARK OFFICE
CERTIFICATE OF CORRECTION

PATENT NO. : 5,748,426
DATED : May 5, 1998
INVENTOR(S) : Bedingfield et al

It is certified that error appears in the above-identified patent and that said Letters Patent is hereby corrected as shown below:

Delete Drawing Sheet 2, consisting of Figure 4, and replaced with Figure 4, as shown on the attached page.

Signed and Sealed this

Seventeenth Day of November, 1998

Attest:

BRUCE LEHMAN

Attesting Officer   Commissioner of Patents and Trademarks

UNITED STATES PATENT AND TRADEMARK OFFICE
CERTIFICATE OF CORRECTION

PATENT NO. : 5,748,426
DATED : May 5, 1998
INVENTOR(S) : Bedingfield, et al

Page 2 of 2

It is certified that error appears in the above-identified patent and that said Letters Patent is hereby corrected as shown below:

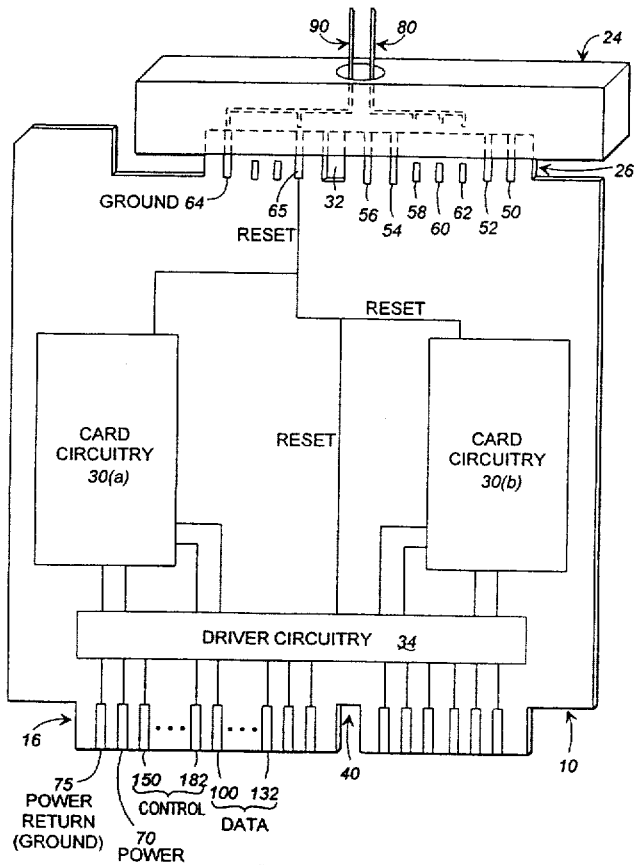

*FIG. 4*